United States Patent
Nair et al.

(10) Patent No.: US 9,153,863 B2
(45) Date of Patent: Oct. 6, 2015

(54) LOW TEMPERATURE CO-FIRED CERAMIC (LTCC) SYSTEM IN A PACKAGE (SIP) CONFIGURATIONS FOR MICROWAVE/MILLIMETER WAVE PACKAGING APPLICATIONS

(71) Applicant: E I DU PONT DE NEMOURS AND COMPANY, Wilmington, DE (US)

(72) Inventors: Deepukumar M Nair, Cary, NC (US); Michael Arnett Smith, Wake Forest, NC (US); Bradley Thrasher, Durham, NC (US); James M Parisi, Stem, NC (US); Joao Carlos Malerbi, Westfield, IN (US); Elizabeth D Hughes, Raleigh, NC (US)

(73) Assignee: E I DU PONT DE NEMOURS AND COMPANY, Wilmington, DE (US)

( * ) Notice: Subject to any disclaimer, the term of this patent is extended or adjusted under 35 U.S.C. 154(b) by 308 days.

(21) Appl. No.: 13/749,221

(22) Filed: Jan. 24, 2013

(65) Prior Publication Data
US 2013/0189935 A1 Jul. 25, 2013

Related U.S. Application Data

(60) Provisional application No. 61/590,253, filed on Jan. 24, 2012, provisional application No. 61/740,574, filed on Dec. 21, 2012.

(51) Int. Cl.
*H01Q 1/38* (2006.01)
*H01Q 1/22* (2006.01)

(52) U.S. Cl.
CPC .............. *H01Q 1/38* (2013.01); *H01Q 1/2283* (2013.01); *H01L 2223/6677* (2013.01); *H01L 2224/16225* (2013.01); *H01L 2224/48091* (2013.01); *H01L 2224/48137* (2013.01); *H01L 2224/48227* (2013.01); *H01L 2924/15153* (2013.01); *H01L 2924/15192* (2013.01); *H01L 2924/15311* (2013.01); *H01L 2924/15321* (2013.01); *H01L 2924/15331* (2013.01); *H01L 2924/16195* (2013.01)

(58) Field of Classification Search
USPC ............ 343/700 MS, 893; 257/698, 700, 723
See application file for complete search history.

(56) References Cited

U.S. PATENT DOCUMENTS

| | | | |
|---|---|---|---|
| 5,023,624 A | 6/1991 | Heckaman et al. | |
| 6,297,551 B1 * | 10/2001 | Dudderar et al. | 257/723 |
| 7,675,465 B2 | 3/2010 | Doan et al. | |
| 8,502,735 B1 * | 8/2013 | Moosbrugger et al. | 343/700 MS |
| 2010/0213602 A1 * | 8/2010 | Smeys et al. | 257/698 |
| 2010/0283085 A1 * | 11/2010 | Bemanian et al. | 257/209 |
| 2010/0327068 A1 | 12/2010 | Chen et al. | |
| 2012/0212384 A1 | 8/2012 | Kam et al. | |
| 2012/0280380 A1 * | 11/2012 | Kamgaing | 257/679 |
| 2013/0141284 A1 * | 6/2013 | Jeong | 343/700 MS |

* cited by examiner

*Primary Examiner* — Tan Ho (57) ABSTRACT

Disclosed are methods and devices of microwave/millimeter wave package application.

16 Claims, 8 Drawing Sheets

LOW TEMPERATURE CO-FIRED CERAMIC (LTCC) SYSTEM IN A PACKAGE (SIP) CONFIGURATIONS FOR MICROWAVE/MILLIMETER WAVE PACKAGING APPLICATIONS

CROSS-REFERENCE TO RELATED APPLICATIONS

This application claims the benefit under 35 U.S.C. 119(e) to U.S. Provisional Application No. 61/590,253 filed Jan. 24, 2102 and U.S. Provisional Application No. 61/740,574 filed Dec. 21, 2012.

FIELD OF THE INVENTION

Disclosed are methods and devices of microwave/millimeter wave package application.

BACKGROUND

Low Temperature Co-fired Ceramic (LTCC) technology is an electronic packaging platform especially suitable for high frequency system level packaging applications. A typical LTCC circuit substrate is formed by laminating multiple layers of ceramic tape under pressure and then fired at high temperatures in the range of 800 to 900 degrees C. On firing, LTCC forms a monolithic circuit containing electrical interconnections and provides for a highly reliable integrated circuit chip carrier platform. Electrical interconnections on LTCC substrates are generally formed by using thick film metallizations of gold, silver, or copper metals. Being a ceramic material, LTCC is a high reliability system and also has very good thermal properties in addition to extremely low dielectric loss for electrical signals. LTCC has a coefficient of thermal expansion (CTE) relatively close to that of semiconductor materials used for fabricating chips thereby making high reliability flip chip attachment possible.

A transceiver is a system that combines the functions of a transmitter and receiver in the same circuit. A practical transceiver circuit is realized with a set of Millimeter Wave Integrated Circuit (MMIC) chips, interconnect metallizations patterned according to strict geometric requirements, passive components such as resistors, capacitors, and inductors, metal patterns forming antenna elements and arrays, and antenna networks. Each of these sub systems and components impose somewhat conflicting performance requirements on package configurations.

State of the art transceiver packaging solutions use different materials within the same package due to differing requirements imposed by various subsystems. For example, reliable flip chip attachment require a ceramic substrate while good antenna performance required a low dielectric constant and hence the use of organic laminates. The multi-material packaging approaches result in complex package configurations resulting in performance impairments and expensive solutions. Both higher performance and lower cost can be realized if a single substrate packaging solution can be provided. The concepts described here offer such high performance and lower cost package approaches.

SUMMARY

In a first embodiment, the invention is directed to an integrated circuit package configuration including (a) an antenna system having extending antenna elements; (b) a substrate having a first side, a second side and network internal transmission lines continuous from the first side to the second side, wherein the antenna system is attached to the first side and the second side defines at least one cavity; and (c) at least one monolithic microwave integrated circuit (MMIC) mounted in the at least one cavity defined by the second side, wherein the extending antenna elements extend via the network of internal transmission pathways of the substrate and contact the MMIC establishing a transceiver circuit.

In another embodiment, the invention is directed to a method for receiving and transmitting a signal including (i) in an integrated circuit package configuration receiving a first signal via the antenna system; (ii) enabling power division and combination via the extending antenna elements; (iii) providing phase shifting via the extending antenna elements; and (iv) accepting a composite signal via steps (ii) and (iii) at the MMIC, wherein the first signal received is at millimeter wave frequencies.

DETAILED DESCRIPTION

In a first embodiment, the invention described includes of two subsystems—one chip carrier subsystem and another antenna subsystem—assembled together to form a single chip scale package. The package configuration is suitable for microwave/millimeter wave systems (frequencies higher than 30 GHz). The package as described here forms a fully integrated, self-contained transmitter/receiver (transceiver) system and antennas built on the same package. The following description specifically assumes Low Temperature Co-fired Ceramic (LTCC) as the dielectric material used for the package while any dielectric material with suitable electrical and mechanical properties (for example, Liquid Crystal Polymer (LCP) can be used in its place. General configurations of proposed package structures are shown in figures below.

Figure 1A:
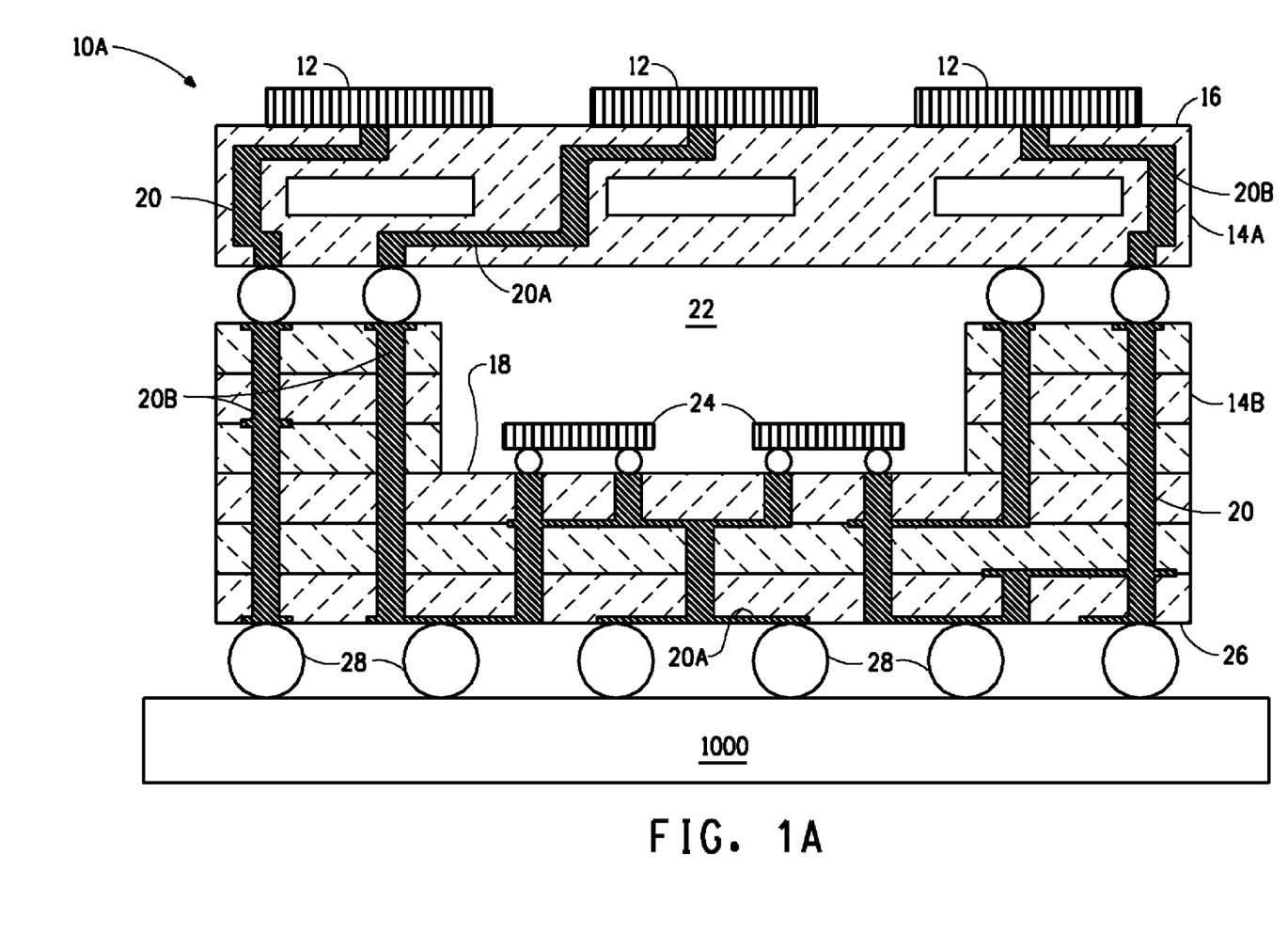
FIG. 1A is a plan view of a first embodiment of a package of the present invention attached to a mother board.
Figure 1B:
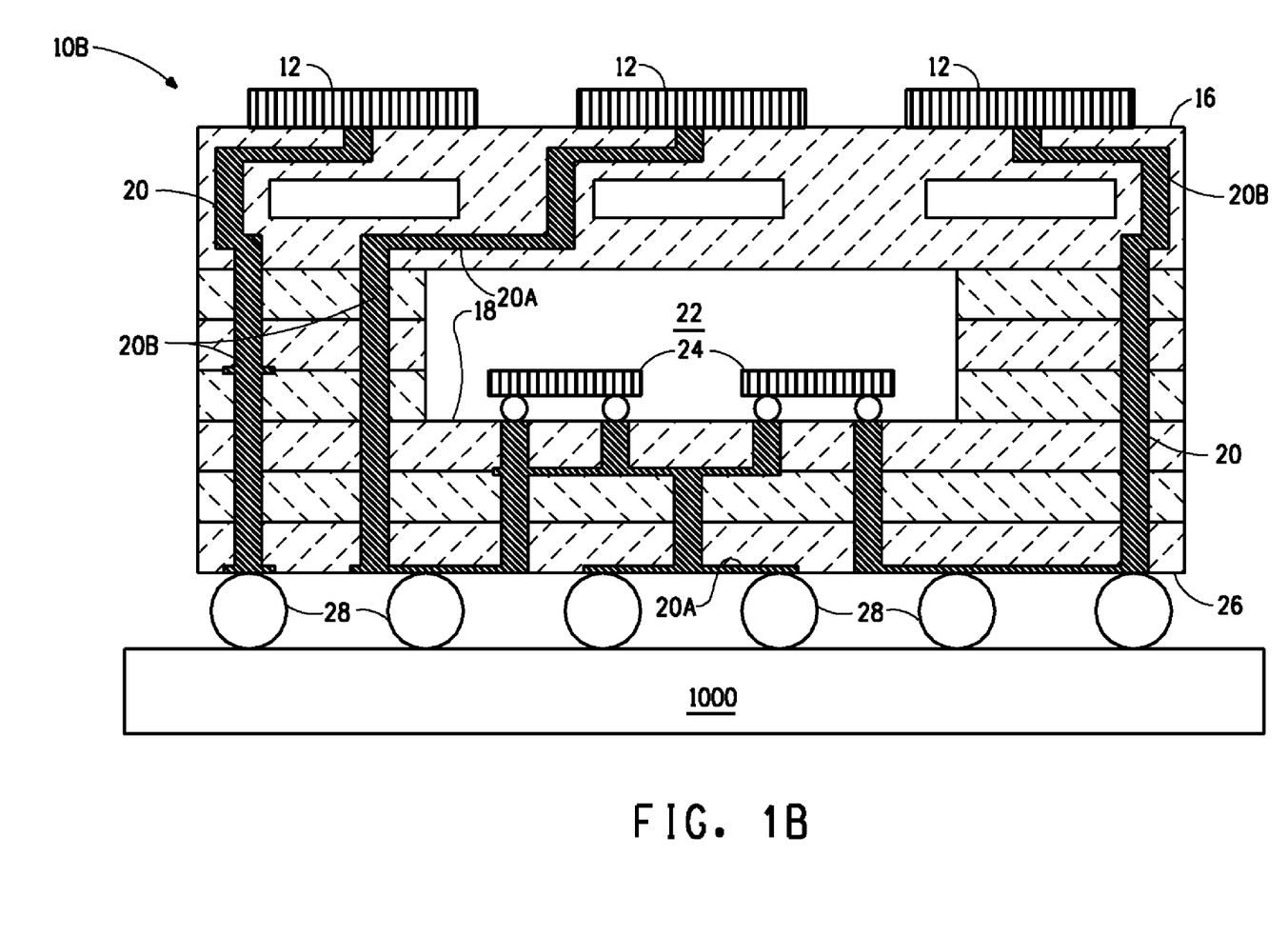
FIG. 1B is a plan view of the package of the first embodiment.

Referring to FIGS. 1A and 1B various aspects of a first embodiment of the invention are illustrated. In a first embodiment, the invention is directed to an integrated circuit package configurations 10A 10B including (a) an antenna system 12 having extending elements (not shown); (b) a substrate 14 having a first side 16, a second side 18 and a network of internal transmission lines 20 of via fill (metal) paste 20A in the vertical direction and conductor pastes 20B in the horizontal direction, continuous from the first side 16 to the second side 18, wherein the antenna system 12 is attached to the first side 16 and the second side 18 defines at least one cavity 22; and (c) at least one monolithic microwave integrated circuit; "MMIC", also referred to herein as "chips" 24 mounted in the at least one cavity 22 defined by the second side 18, wherein the extending antenna elements extend via the network of internal transmission lines 20 of the substrate 14 and contact the MMIC 24 establishing a transceiver circuit.

The substrate 14 in the present embodiment is of LTCC but can be of any other dielectric material with suitable dielectric and multilayer properties such as Liquid Crystal Polymer (LCP). The cavity 22 depth can be adjusted as necessary but needs to be at least 25% larger than the height of the chips (including attachment structures) so that the MMIC 24 can be completely situated within the cavity 22. The length and width of the cavity 22 can be selected to accommodate all the MMIC 24 that are to be packaged to ensure easy access for the assembly equipment. The bottom exterior surface 26 of the substrate 14 has the terminations 28 required for necessary electrical, mechanical, and thermal interconnections to external systems such as a general purpose PCB (printed circuit board) 1000. Without having to be limited the interconnections to the external system are commonly ball grid array (BGA) balls mounted to the substrate to a printed circuit board.

Referring to FIG. 1A, electrical interconnections between the chips, between chips and BGA terminations, as well as between the chip and the antenna extending element subsystem are realized with controlled impedance transmission lines 20 fabricated within the multilayer LTCC substrate 14. Internal transmission lines 20 are fabricated using thick film metal pastes either screen printed or patterned with laser ablation process on individual LTCC layers. Specially formulated via metal pastes are used for vertical interconnections between the conductors in each layer as customary in standard LTCC processing. Specially formulated means that the thick film conductor pastes have specific amounts of ceramic, glass, metal, and organic components so that their electrical properties are optimized for packaging applications. In addition such pastes are formulated so that they have matching mechanical properties to that of the LTCC tape. Usage of multilayer LTCC substrate 14 also enables embedding passive components such as resistors and capacitors within the dielectric stack thereby significantly reducing the overall package size.

Referring to FIG. 1A, the interface between the antenna carrier substrate portion 14A and the chip carrier substrate portion 14B can be realized by direct attach of the two substrates portions 14A, 14B through solder or conductive epoxies or through controlled impedance BGA structure. For this purpose ground-signal-ground pads for electrical interconnection can be provided at specified locations predefined on the two LTCC substrates so that the two substrates portions 14A, 14B can be aligned together to form the overall package. In addition to the electrical pads, additional mechanical and thermal management pads can be used to enhance the mechanical strength (and to provide a highly thermally conductive path for heat dissipation) of the joint between the two substrates portions 14A, 14B so as to meet any required reliability performance targets.

Chip Mounting and Interconnections

Figure 2:
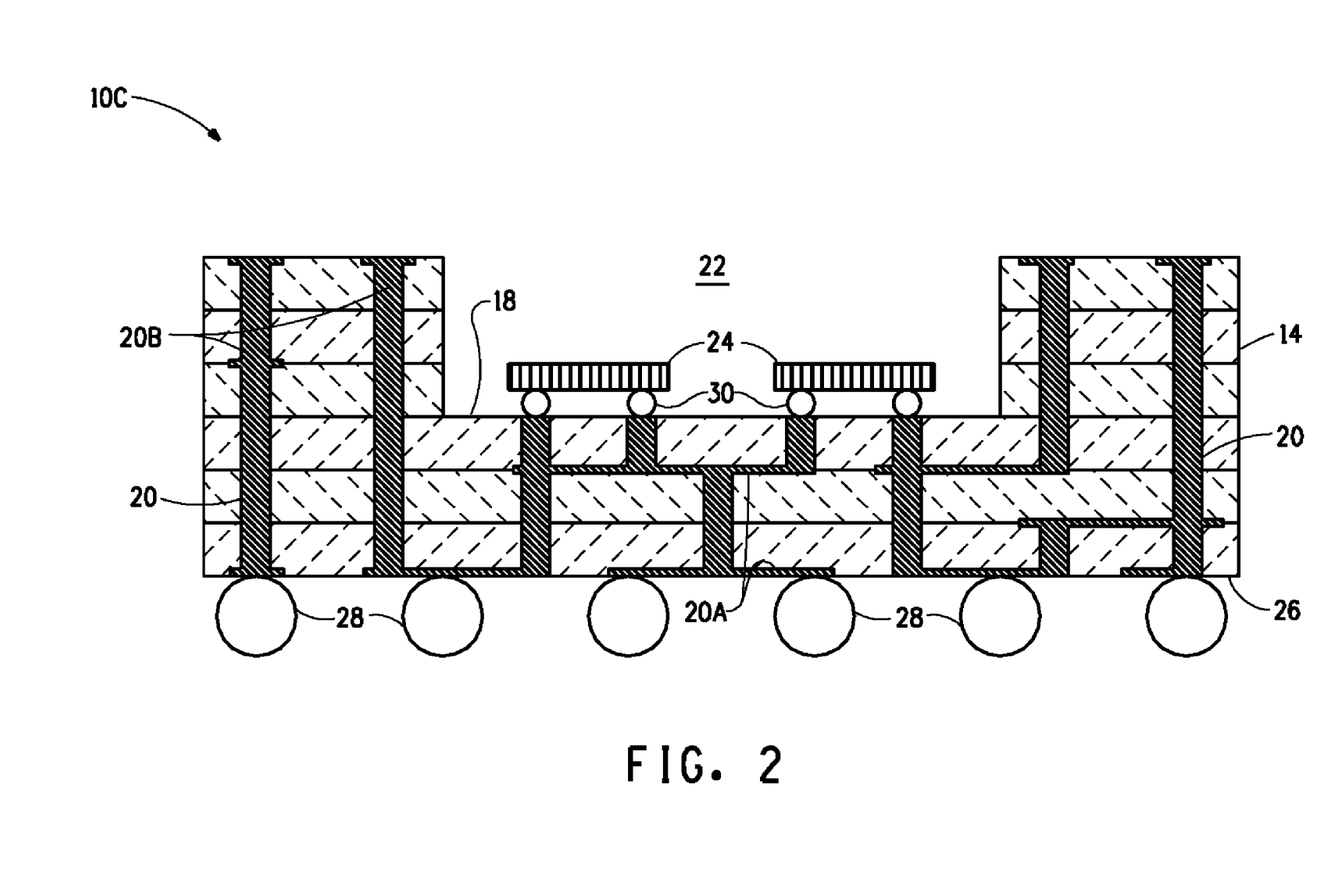
FIG. 2 illustrates the package substrate with flip chip attached MMIC.

Referring to FIG. 2, the chip portion 14B of the package 100 is illustrated with MMIC 24 mounted on the second side (floor) 18 of the cavity 22. There are metal pads 30 (gold, silver, or copper) fabricated by utilizing thin film or thick film deposition and patterning (such as vacuum deposition of thin film metals followed by photolithography and etching or screen printing of thick film metal pastes) techniques for chip attachment which can be either solder or conductive epoxy.

Figure 3:
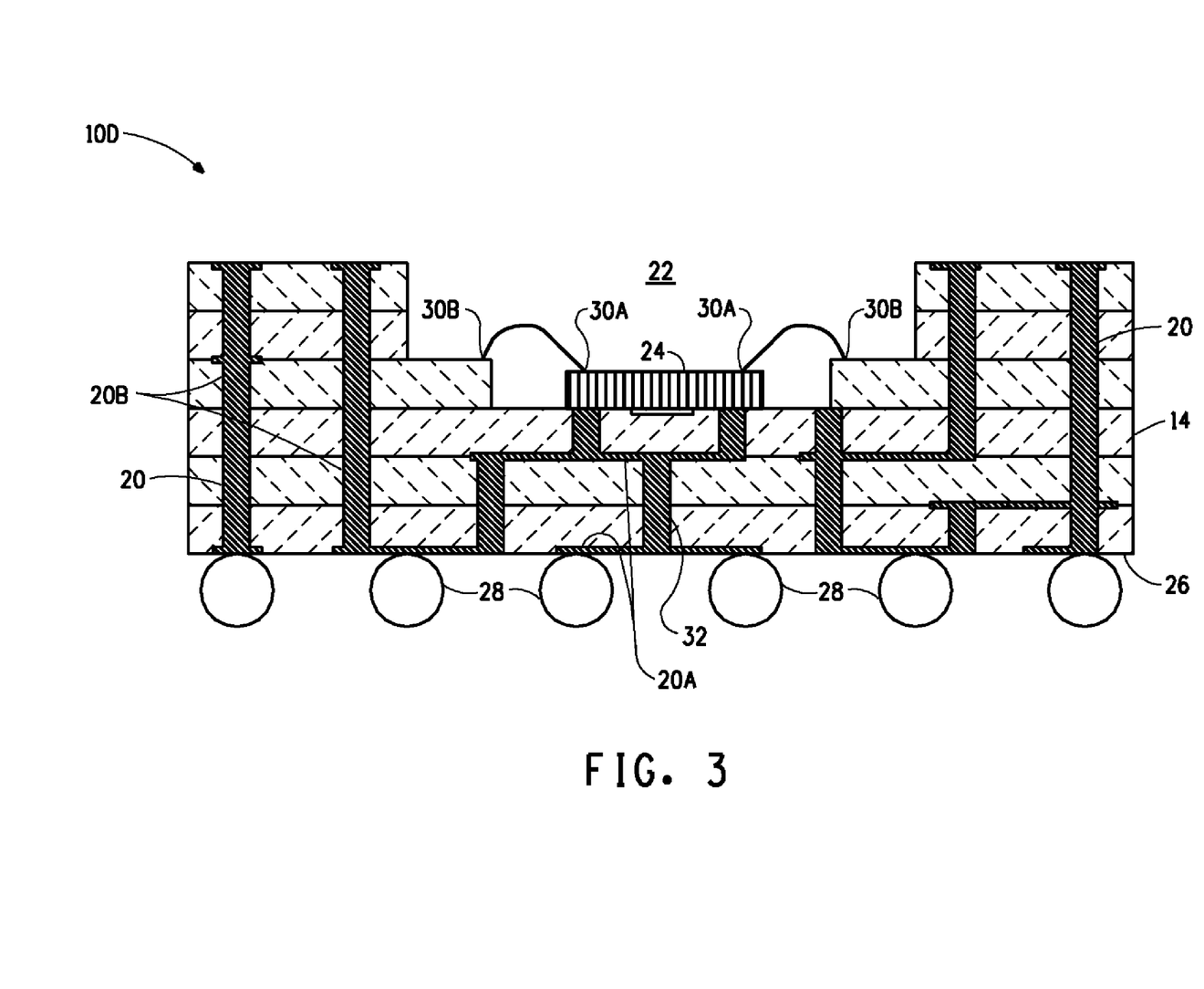
FIG. 3 illustrates the package substrate with "double-cavity" and wire bond interconnect.

Referring to FIG. 3, in another aspect of this embodiment 10D, it is also possible to attach the MMIC 24 in a "face up wire-bonded" 30A fashion. In this case there can be wire bond pads on cavity 22 floor 18. At millimeter wave frequencies it is critical to maintain the shortest possible wire bond length along the signal path to reduce parasitic inductances which will severely restricts the performance of the chips. To alleviate this problem a "double cavity" approach as shown in FIG. 3 can be used where the chips 24 are placed within a secondary cavity 22A fabricated within the first cavity 22 such that the wire bond pads 30A on the chips 24 will be coplanar with the pads 30B on the floor of the first cavity 22. In the case of flip chip attached MMIC 24; it is possible to use a suitable under fill material (not shown) to fill the space between the bottom surface of the chips 24 and the cavity floor 18 to ensure thermal expansion matching and hence higher reliability. In addition, the interior surfaces of the cavity 22 can be lined with suitable microwave absorber materials to suppress unwanted cavity resonances.

Antenna Subsystem Description

All transceivers use some form of an antenna for transmitting and/or receiving high frequency electrical signals. The invention described here uses a specific type of antenna structure called microstrip patch antenna which is formed by patterning metallization deposited or by printing metallization on a suitable dielectric substrate. The nature of metallization, its geometry, the dielectric properties of the substrate material etc. are some of the critical variable that determines the performance of microstrip antennas. In general, the microstrip patch antennas used with the present invention can be a single patch element of rectangular, circular, or any other geometrical shape, or a multitude of such patch elements interconnected by suitably designed 'network' forming an antenna array. Antenna elements are electrically connected to the output section of such an array can be exclusively reserved for different functions such as transmission or reception of signals. In certain other applications the entire microstrip array can be used for either transmission or reception at any given time. Electronic switching circuits can be added to the antenna system 12 to switch between functions when entire antenna is dedicated for one function at any given time.

The antenna system 12 also enables power division/combination and phase shifting functions which are essential for the operation of the antenna array. Power divider circuit splits the output of the transmitter so that a specified amount of power can be directed to each of the antenna "element". The same circuit can be used in reverse for the receiver such that power received by each antenna element can be combined to form a composite signal forming the input to receiver circuitry. Antenna array also require a specified phase relationship between its individual elements. A phase shifter circuit can be used to realize this function. Both power divider/combiner and phase shifter circuits are generally implemented as interconnected discrete components such as resistors, capacitors, inductors, and integrated circuits.

Microstrip Antenna Design and Fabrication

Generally, microstrip antennas are fabricated by either patterning existing metallization (subtractive process) or by depositing metallization (additive process) on a high quality dielectric material. The dielectric material suitable for antenna implementations needs to have the following characteristics; very low dielectric loss tangent (less than 0.005); relatively lower effective dielectric constant (less than 6); very tight dimensional control over substrate thickness +1-5%; and the ability to support antenna networks at millimeter wave frequencies Low Temperature Co-fired Ceramic dielectric technology provides an excellent choice for antenna substrate since it meets all the critical application. As discussed, this embodiment specifically describes an antenna subsystem fabricated on an LTCC multilayer substrate.

Antenna Patch Design and Realization

Figure 4:
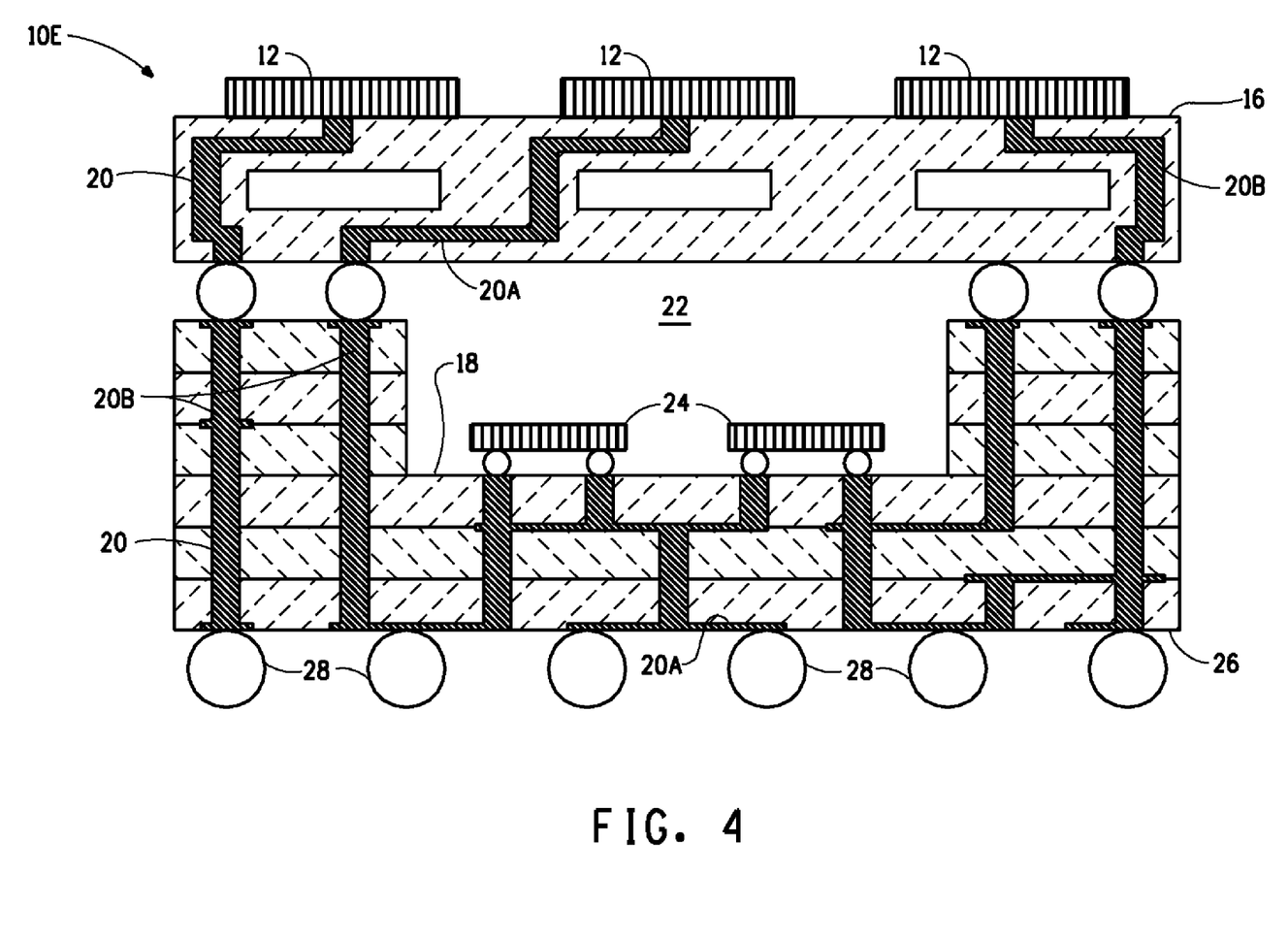
FIG. 4 illustrates the two-piece package substrate with an antenna substrate and a chip substrate connected.

Any standard microstrip antenna design can be used in accordance with the package configuration described herein. The metal patterns used for antenna elements can be realized by screen printing of thick film metal pastes on LTCC substrates with dielectric constant in the range of 4 to 8 and loss tangent less than 0.004. In addition to screen printing either vacuum deposited thin film or laser ablated metallizations can be used as well. Any typically used metallization choices from either thick film or thin film technologies including but not limited to gold, silver, and copper can be used for microstrip antennas. Also, either screen printing, photolithography, laser ablation or a combination of these techniques can be used to realize the metal patterns. Radiating patch (in the case of single patch antenna) or elements (in the case of an antenna array) can be located on either external surfaces of the LTCC slab forming the antenna substrate. In the embodiment 10E in FIG. 4, the case in which the antenna system 12 is located on the external (top) surface of the substrate 14 is illustrated.

Antenna Substrate Choice

In the most general case any dielectric material suitable for high efficiency millimeter wave microstrip antennas can be used as the substrate. The substrate choice can include organic materials such as Teflon, Polyimide, and various epoxy resins or ceramic dielectric materials such as alumina, LTCC, aluminum nitride etc. LTCC as the substrate is preferred due to the following reasons: LTCC provides a good range of dielectric properties, dielectric constant in the range of 4.5 to 8, very low loss tangent (less than 0.005), multilayer capability to simplify high density routing of interconnects, the ability to embed passive components in the interior layers of the substrate so that the antenna can be integrated directly on the antenna substrate, and the ability to fabricate integrated open and embedded cavities within the substrate enabling cavity-backed antenna structures. The presence of such cavities—air pockets—under the antenna elements reduces the effective dielectric constant of the substrate material. Hence, effective dielectric constant can get as low as 2.5 thereby increasing the radiation efficiency of the antenna significantly.

In the invention disclosed herein the electronic components for the network—both power combiner/divider and phase shifters—can either be discrete devices attached to the external surfaces of the LTCC substrates or can be integrated as screen printed thick film based components on the internal layers of the LTCC substrate. The later approach significantly reduces the valuable surface area used by passive components and results in significant reduction in the overall size of the package.

Network of Transmission Lines

As illustrated in FIGS. 1A-4, the network of internal transmission lines 20 includes a group of controlled impedance electrical interconnects transmitting electrical signals from the input/output terminals of the transceiver circuit and antenna elements. In very simple antenna designs the network can be a simple branch network of transmission interconnects which starts at the transceiver terminals as a single transmission line and then divides in to multiple branches. The branching continues until the number of branched lines is equal to the number of antenna elements and each branch line terminates at individual elements. In typical implementations of the antenna lines more functions are integrated beyond typical signal interconnections. Power dividers and phase shifters are electronic circuit comprised of components such as resistors, capacitors, inductors, and some in some cases integrated circuits. In the presented embodiment such components can be either attached directly to the LTCC antenna substrate using solder or conductive epoxy; or can be integrated in to the internal layers of the substrate. In the latter case, resistive and capacitive thick film paste compositions are used to screen print the required passive functions during the fabrication of the substrate.

The use of multilayer LTCC of the present embodiment 10A-10E variations as illustrated in FIGS. 1A-4 as the antenna substrate makes it easier to route the transmission lines forming the fee network since the internal layers of the substrate are available for such routing. In addition, mechanical punched or laser drilled via holes filled with suitable thick film conductive pastes are used for interconnecting various internal planes of the LTCC along the vertical direction.

Figure 5:
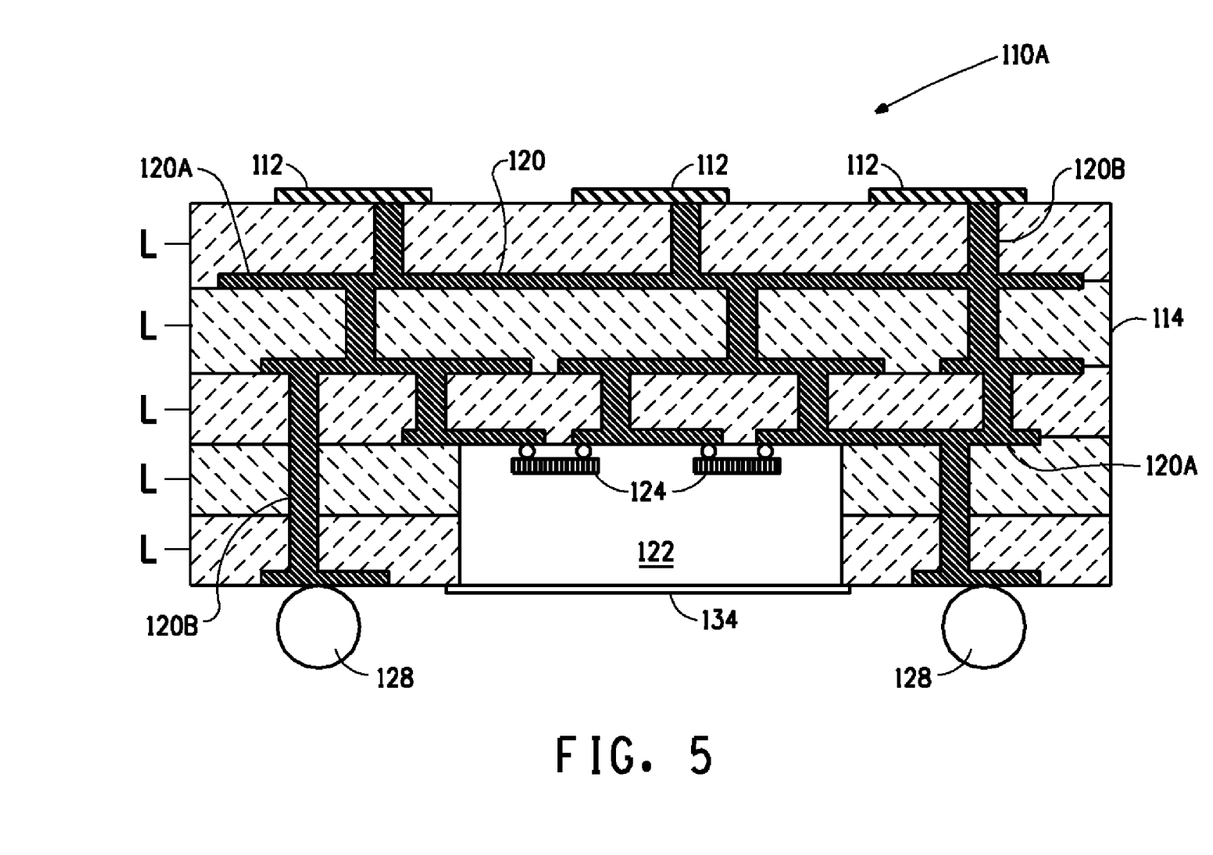
FIG. 5 is a plan view of a one-piece embodiment of the present invention.
Figure 6:
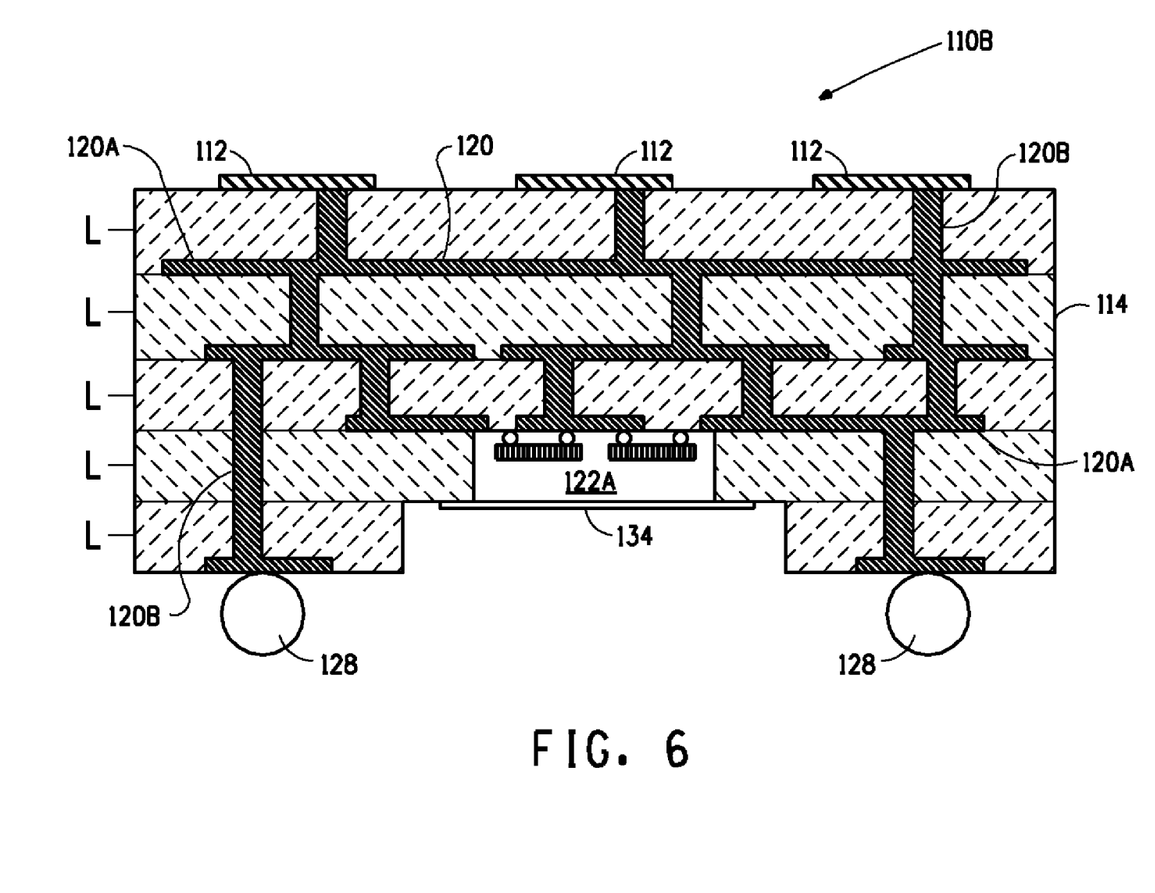
FIG. 6 is a plan view the one-piece embodiment illustrating a stepped cavity and lid.
Figure 7:
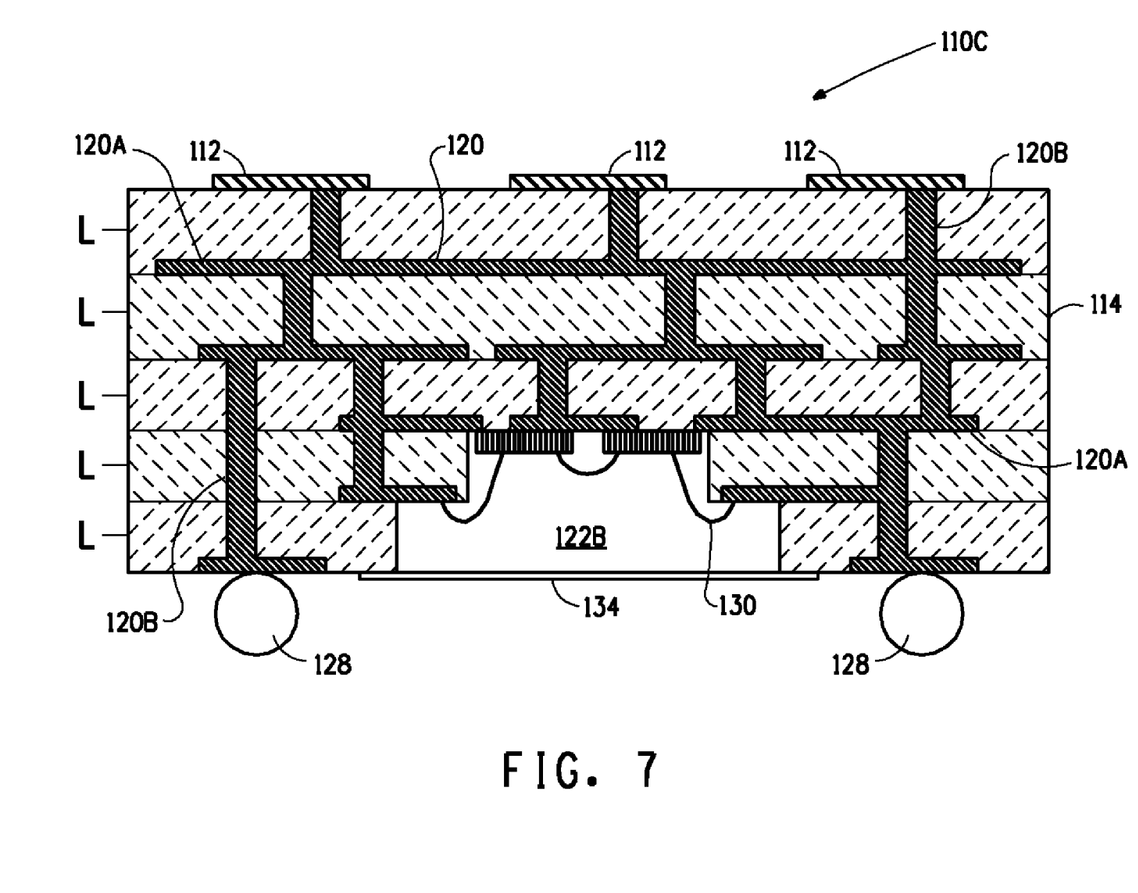
FIG. 7 is a plan view of the one-piece embodiment illustrating wire bonding.

Referring to FIGS. 5, 6 and 7, n variations 110A, 110B, 110C of a second embodiment, the LTCC substrate 114 is of one-piece design. FIG. 5 describes the generic one-piece package configuration to enable the realization of specific functional requirements. All concept configurations are built on multiple layers of LTCC substrate. The specific drawings are shown with 5 layers of 5 mil LTCC tape but the configurations are equally applicable to more complex circuits which require may more layers—4 to 40 layers—and with 10 mil individual tape layers. Referring to FIG. 5, a schematic diagram of the generic configuration is shown. The substrate 114 is built with five layers (marked "L") of 5 mil 9K7 LTCC tape although other thicknesses, layer counts, and tape systems can be used. On the top surface a microstrip patch antenna array 112 with three elements are shown. For use with the package substrate 114 any planar antenna structure with a single element or a large number of elements can be used. As in the previous embodiment, in addition to the rectangular shaped microstrip antenna patch (illustrated in FIG. 5) other shapes such as circular, triangle, or composite patches can be used as well. Individual antenna extending elements (not shown) of the antenna system 112 are interconnected through the network of internal transmission lines 120 by conductor pastes 120B with planar (horizontal) transmission lines as well as vertical interconnections via fill (metal) pastes 120A. The specific locations, shapes, and other geometric details of metal patterns forming this network can take many forms depending up the specific functionality for the circuit that is being packaged. As shown in FIG. 5, some of the vias are stacked on top of each other and some are used to connect metal patterns on a single layer of LTCC dielectric. Similar to the previous embodiment, a rectangular cavity 122 is formed on the bottom of the LTCC substrate 114 and MMIC chips 124 are mounted using flip chip ball grid array (BGA) 128 attachment on the floor of the cavity 122. The cavity shape can be generic such as circular or other odd shapes according to design requirements. The cavity 122 is sealed with an optional lid 134 for designs which require a sealed enclosure and/or hermetic sealing. The lid sealing can be realized with soldering or brazing the lid 134 to a metal frame (not shown) printed along the periphery of the cavity 122. As discussed, on the bottom 126 of the package 110 solder balls 128 are provided to attach the package 110 to an organic printed circuit board or another ceramic.

Referring to FIG. 6, another aspect of the variation of the second embodiment 110 B describes a "stepped" cavity 122A. The addition of the step on the cavity side wall provides a "ledge" or a "terrace" where the lid 134 can be attached. By this design total volume enclosed within the cavity 122A is significantly reduced there by decreasing chances of detrimental electromagnetic cavity resonances that can be excited in a large size cavity 122 illustrated in FIG. 5. Presence of such cavity resonance can result in significant impairments to the electrical performance of the package and their elimination is highly desired.

Referring to FIG. 7, a wire-bonded aspect 110C is illustrated in the stepped cavity 122A illustrated in FIG. 6. Presence of wire bonds 130 can enhance the chances of excitation of high frequency cavity resonances and their elimination through the stepped cavity approach may be necessary for achieving performance requirements.

As illustrated in FIGS. 5, 6 and 7, the package variations of the second embodiment 110A, 110B, 110C depict a single piece, monolithic, multilayer ceramic packages which house an entire transceiver system including integrated antennas. Such package design eliminates the need for multiple materials to realize all the functions of a transceiver. FIGS. 5, 6 and 7 illustrate package concepts built from the same LTCC panel since it is essentially a single piece LTCC part. This approach doubles the throughput of the manufacturing line by design, leading to very significant reduction in manufacturing cost and cycle time. Since built from a single piece of LTCC, there is no need to attach the antenna and chip carriers together with BGA (as discussed in the first embodiment of the package 10A-10E) as it is a fully integrated structure. The need for reflow process is completely avoided as well as the complexity and cost associated with the assembly process. No assembly is involved other than attaching the chip 124 and the lid 134. The aspects of this embodiment are packages with very high performance. Since the signals flow back and forth between chips 124 and antennas 112 through fully shielded internal transmission lines 120 there is no additional loss incurred due to BGA interface. Further, because the package of the present embodiment illustrated in FIGS. 5, 6 and 7 is made of a single piece of ceramic materials, it results in an extremely high reliability monolithic circuit. Even under harsh operating environments and under heavy shock and vibration no performance impairment is expected; potentially due to being fully sealed hermetic packages.

In another embodiment, the invention is directed to a method for receiving and transmitting a signal including (i) in an integrated circuit package configuration receiving a first signal via the antenna system; (ii) enabling power division and combination via the extending antenna elements; (iii) providing phase shifting via the extending antenna elements; and (iv) accepting a composite signal via steps (ii) and (iii) at the MMIC, wherein the first signal received is at millimeter wave frequencies. The substrate is a Low Temperature Co-fired ceramic material.

To ensure quality and function of both the antenna and chip system, it is advantageous prior to step (i) to accessible components of the integrated circuit package configuration. Specifically, in a multi-piece substrate, the ability to test the function of the package prior to connecting the antenna and chip via the substrate is cost effective, results in higher end of the assembly line yield, and assures quality of the finished product.

As discussed in the previous embodiment, the ability to have a one-piece substrate allows, prior to step (i), configuring the extending antenna elements along the shortest distant between the MMIC and the antenna system via the network of pathways of the substrate. Because any additional length of transmission line and package interfaces such as BGA transition will invariably result in more interconnects losses. Minimizing such losses is one of the primary objectives in any package design.]

Additionally, as discussed in the previous embodiment and prior to step (i), formulating the electrical interconnections for use with the substrate will allow greater efficiency as the signal travels through the substrate of the finished product. Flow properties of the via fill pastes—especially the viscosity—needs to be carefully matched to the sintering properties of the LTCC tape during firing process to ensure a good contact formed by interdiffusion of materials components between the tape and via fill paste. This is essential to achieve the required strength for the tape-via interface. Similarly, sintering properties of the via fill paste and the conductor paste above and below the via making electric contacts need to be carefully matched so that high integrity, void free electrical and mechanical contact is obtained between these conductors. This is achieved through carefully engineering the material compositions of the said conductors and via fill paste materials.

What is claimed is:

1. An integrated circuit package configuration comprising:
   (a) an antenna system having extending antenna elements;
   (b) a substrate having a first side, a second side and a network of internal transmission lines continuous from the first side to the second side, wherein the antenna system is attached to the first side and the second side defines at least one cavity;
   (c) at least one monolithic microwave integrated circuit (MMIC) mounted in the at least one cavity defined by the second side,
   wherein the extending antenna elements extend via the network of transmission lines of the substrate and contact the MMIC establishing a transceiver circuit, wherein the package further comprising ball grid array (BGA) balls mounted to the substrate to printed circuit board, wherein the MMIC and the antenna system are attached to the substrate using an attachment method consisting of (i) soder attachment, (ii) conductive epoxy attachment, (iii) BGA attachment and (iv) wire bond attachment.

2. The package of claim 1, further comprising electrical interconnections specifically formulated for use with the substrate.

3. The package of claim 2, wherein the substrate is made of a dielectric material consisting of the group of a Low Temperature Co-fired Ceramic (LTCC) or Liquid Crystal Polymer (LCP).

4. The package of claim 3, wherein the at least one cavity has a depth of at least 25 percent greater than the height of the MMIC.

5. The package of claim 4, wherein the at least one cavity is a stepped form.

6. The package of claim 5, wherein the at least one cavity is sealed with a lid.

7. The package of claim 6, wherein the seal is hermetic.

8. The package of claim 7, wherein the MMIC has a frequency range of 10 to 120 GHz.

9. The package of claim 8, wherein the antenna system comprises a microstrip patch antenna.

10. The package of claim 9, wherein the substrate is one-piece.

11. The package of claim 9, wherein the substrate is multiple-piece layers.

12. A method for receiving and transmitting a signal comprising:
   (i) in a integrated circuit package configuration of claim 1, receiving a first signal via the antenna system;
   (ii) enabling power division and combination via the extending antenna elements;
   (iii) providing phase shifting via the extending antenna elements; and (iv) accepting a composite signal via steps (ii) and (iii) at the MMIC, wherein the first signal received is at millimeter wave frequencies.

13. The method of claim 12, wherein the substrate is a Low Temperature Co-fired ceramic material.

14. The method of claim 13, wherein prior to step (i) formulating the conductor paste as well as vertical interconnections via fill (metal) paste for use with the substrates.

15. The method of claim 12, wherein prior to step (i) testing accessible components of the integrated circuit package configuration.

16. The method of claim 12, wherein prior to step (i) configuring the extending antenna elements along the shortest distant between the MMIC and the antenna system via the network of pathways of the substrate.

* * * * *